United States Patent [19]

Advani et al.

[11] Patent Number: 5,862,381
[45] Date of Patent: Jan. 19, 1999

[54] VISUALIZATION TOOL FOR GRAPHICALLY DISPLAYING TRACE DATA

[75] Inventors: Deepak Mohan Advani, Poughkeepsie, N.Y.; Michael Justin Byron, Simsbury, Conn.; Steven Robert Hansell, Shokan; Todd Ming Chun Li, Kingston, both of N.Y.; John Paul Marino, Poughkeepsie, N.Y.; Rajendra Datta Panda, Austin, Tex.; James Andrew Pierce, Whitney Point; Ko-Yang Wang, Chappaqua, both of N.Y.; Dennis George Weinel, Poughkeepsie, N.Y.; Robert Spencer Welch, Clifton, N.J.

[73] Assignee: International Business Machines Corporation, Armonk, N.Y.

[21] Appl. No.: 756,446

[22] Filed: Nov. 26, 1996

(Under 37 CFR 1.47)

[51] Int. Cl.[6] .................................................. G01R 13/00
[52] U.S. Cl. .......................................... 395/704; 345/123
[58] Field of Search .................................. 395/502, 507, 395/520, 704; 345/123, 125, 131, 331, 334, 339

[56] References Cited

U.S. PATENT DOCUMENTS

| 5,168,554 | 12/1992 | Luke | 707/509 |
| 5,528,735 | 6/1996 | Strasnick et al. | 345/427 |

*Primary Examiner*—Thomas Peeso
*Attorney, Agent, or Firm*—Lily Neff

[57] ABSTRACT

A visualization tool for creating graphic displays of trace data produced by a parallel computer program execution monitoring system. The visualization tool contains a display monitor, possible input devices, a mass storage device, and a computer system. Trace data is converted into data structures and later pixel maps to ultimately generate processing activity diagrams for each processor in the computer system. If more than one processor is present, more than one processing activity diagram can be generated and simultaneously displayed on the same screen in form of strip graphs and for certain indicated time intervals. An average processor utilization diagram is then calculated and plotted on every processor activity diagram for comparison purposes. Browsing through these strip graphs all at the same time while comparing them against the average utilization graph will allow a user to easily redistribute workload if necessary and/or locate problem situations.

22 Claims, 12 Drawing Sheets

STRIPGRAPH_POPUP

TIME: 721087825

INDIVIDUAL PROCESSOR STATISTICS

| PROC. # | MEAN | STD. DEV. |
|---------|------|-----------|
| 0 | 625<br>47.77 | 626<br>30.03 |
| 1 | 54.71 | 24.52 |
| 2 | 49.92 | 25.71 |
| 3 | 53.02 | 27.43 |
| 4 | 50.94 | 31.95 |
| 5 | 47.08 | 26.12 |
| 6 | 42.40 | 26.54 |
| 7 | 43.52 | 29.97 |
| 8 | 50.48 | 30.39 |

SORT BY: ◆ PROC# ◇ MEAN  ◇ STD. DEV.
627

◆ ASCENDING ◇ DESCENDING 628

APPLY

AGGREGATED PROCESSOR STATISTICS 624

| MAX. | PROC# 1 623 | MIN. | PROC# 13 |

| AGGREGATED PROCESSOR MEAN: 47 | AGGREGATED PROCESSOR STANDARD DEV. 24.52 |

FIG. 6B

VISUALIZATION TOOL FOR GRAPHICALLY DISPLAYING TRACE DATA

FIELD OF INVENTION

The present invention is generally directed to a method of execution and analysis of computer programs, and more particularly to a method of creating graphics of results yielded by a computer program execution monitoring system.

BACKGROUND OF THE INVENTION

In order to improve performance of computer code used in parallel processing computer systems, it is often necessary to determine and display certain data that is indicative of code execution. Generally, computer program execution monitoring systems, hereinafter referred to as monitoring systems, monitor computer programs as they are executed on parallel nodes or a parallel processing computer. The monitoring system subsequently generates data indicative of various functions performed by each node during program execution and stores this data in a mass storage memory device.

The monitoring system organizes the stored data into a historical file known as a trace file; the data within the trace file is known as trace data. Trace data are generally a time-ordered series of recorded indicia representing changes to the information and/or control state of the parallel processing computer. Therefore, trace files are used both for real time debugging of program and system elements as well as for studies Each individual datum within the trace data is known as an event. Typically, an individual event contains a number of data fields. The type of event being recorded defines the number of fields in a given event and the information contained in each field. For example, a monitoring system produces a "send" event whenever one processor within the parallel processing computer passes information to another processor within the same computer. Another example is "receive" event, produced whenever a processor in the parallel processing environment receives a message from another processor.

An event may contain several information such as a time field indicating when the event was recorded by the monitoring system, an event processor field identifying the processor to which the message is directed, a start time field indicating a time that the message was sent or received, and a stop time field indicating the completion time of the event.

Those skilled in the art appreciate that the production and use of trace data is well known in the art and does not require further discussion since it is not per se necessary to understand the workings of the present invention.

As explained earlier, trace files are used either to study the system or as a debugging tool. Typically, a parallel processing computer in cooperation with a monitoring system displays trace data as a single, real time display while the computer executes a parallel program. The data is then stored via a direct access storage device (DASD) or other such storage devices for future use and analysis. Therefore, when the trace data is later sorted, errors and anomalies that occurred during program execution can be corrected.

Similarly by analyzing the trace data stored, a study of processor utilization can be made to optimize such use. One such data processing and display method is enclosed in U.S. Pat. No. 5,168,554 entitled "Converting Trace Data From Processor Executing In Parallel Into Graphical Form", issued to Charles A. Luke on Dec. 1, 1992 (herein after referred to as the Luke patent). Specifically, the Luke patent discloses a method of creating a "time process diagram" that depicts processor utilization during execution of a parallel program. The method includes searching previously recorded trace data for specific types of events, especially those events that indicate processor utilization, and generating a table of those events. The events in the table are arranged in a time sequential manner. From the table, the method disclosed in the Luke patent produces either a diagram or display showing a total number of processors operating during a particular time interval or a diagram showing specific event activities which occurred during that particular time interval. The user can scroll forward and backward within either diagram to display a different time interval than previously displayed. From these displays, a programmer can alter the parallel program to optimally execute on a particular parallel processing computer.

Inasmuch as conventional display apparatus known in the art typically concurrently displays trace data from many processors in a single display format, a programmer faces a tedious, burdensome and often confusing task of simultaneously visualizing relative performance data for more than a small number and comparing the trace data therefrom. Traditionally, the trace data displays portray the data in a textual format only, or in a mixed textual and graphical format. However, even in instances such as in Luke patent where non-textual data displays are available there are no available data portraying a detailed presentation of each processor's functioning as would be necessary in real time debugging. For example in Luke since the main concern is system utilization optimization, no emphasis is placed on detail visual displays of single processor workings. Moreover, the art presently does not provide methods of generating multiple and simultaneous displays of various trace data display formats. In addition in the present art there are no methods or apparatus that can show why a particular processor took more than average time for a particular task or a method that can flag possible on-going problems. Many display devices do not even calculate what an average time for task processing of a certain nature should be, but more importantly these devices do not clearly show the existence of such occurrences such as interrupts as part of their utilization diagrams.

Consequently, in an application program that extends over a relatively large number of processors, reviewing and analyzing the trace data can simply be too daunting to be practically accomplished by even an experienced programmer. Trace files generated by parallel processes contain information about dozens or even hundreds of processors. A visualization tool must be created that can handle any reasonable number of processors in a way that images projected are neither overwritten nor scaled down to such small size that they are un-interpretable by the user. The displays must also allow the user to make quantitative comparisons between the data of different processors and draw attention to display of statistically anomalous processor activity. Thus a need exists in the art for improved systems and methods that can afford a user the ability to quickly access, easily review and understand trace file data, as well as determine and highlight any problems with each individual processor.

Visual presentation devices in existence today do not provide a developer means of easily identifying glitches or bottlenecks in the application. For example, application developers are forced to make inferences concerning the relationships between various types of data that are presented in order to understand how to improve execution of the application program. Similarly, system activity caused by the application under inspection as well as system activity unrelated to the application is not identified by current displays. The user needs to be able to determine where their program is being interrupted from doing work or when their program could be doing useful work instead of waiting. Furthermore, the application developer typically must accept the content and presentation of the data as it is presented to them by the program visualizer rather than being able to specify the types of data that get displayed, and the relationships between these types of data.

The teachings of the present invention are further established on the basic workings and concepts presented originally in U.S. Ser. No. 011,436 (attorney docket KI9-92055) and filed on Jan. 29, 1993, now abandoned. However, the present invention presents novel ideas and other improvements over the concepts previously presented in that abandoned application. In addition, this invention is being filed at the same time with another application, attorney docket KI9-94-004 pertaining to related subject matter.

SUMMARY OF THE INVENTION

An object of the present invention is to provide the user of a visualization tool information about a large number of processors and their activity with ease, allowing the user to concentrate and focus on any areas of anomalous or extreme processor inactivity.

Another object of the present invention is to provide means to distinguish and highlight any anomaly within each executing task or processor.

Yet another object of the present invention is to provide information about program inactivity time, such as interrupts and abstractions, including their type and frequency, in a concise, easy to understand format within a single display.

In accordance with one embodiment of the present invention, a method of graphically displaying trace data using a visualization tool is suggested. The trace data is converted into data structures from which pixel map diagrams are created for selected time intervals. The visualization tool includes a display monitor for displaying pixel map diagrams, a mass storage device for storing data structures and diagrams, and a computer system connected to the display monitor and mass storage device. A diagram can be selectively displayed for the user for each processor, indicating processing activity during a time interval. For each processor, an average processor utility time across all processors is graphically generated. In another embodiment shaded areas indicating standard deviation above and below actual processor activity graph is also generated. In this manner processor inactivity time, or below or above average work load distribution can be tracked and detected. In an alternate embodiment of the present invention inactivity time, such as interrupt time, can be even highlighted further.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 6B is a pop-up menu allowing the user to alternatively sort/view strip graphs in alternate orders.

DETAILED DESCRIPTION OF THE INVENTION

The teachings of the present invention can be readily utilized for display of any data which is produced in a parallel manner, but the present invention is particularly suitable for displaying trace data from a parallel processing computer.

Figure 1:
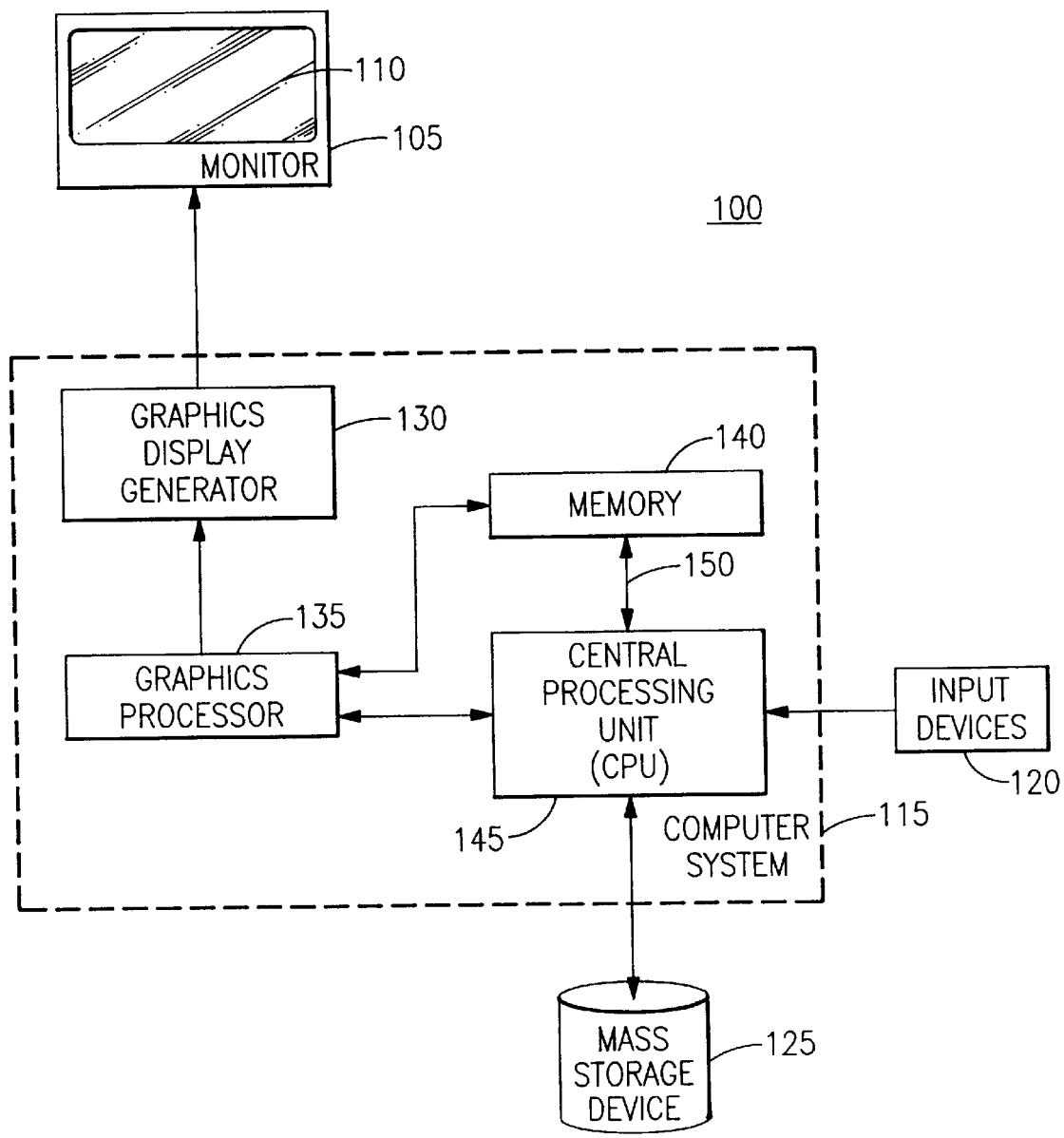
FIG. 1 is a high level block diagram of visualization tool for producing graphical displays in accordance with our invention.

FIG. 1 is a block diagram of visualization tool 100 which is arranged in accordance with our invention for producing display windows on screen (110) of computer display monitor (105). Visualization tool (100) contains computer display monitor (105), computer system (115), mass storage device (125) and input devices (120). Typically, the mass storage device is a tape drive or hard disk drive. Additionally, the input devices typically include a keyboard and a mouse or other similar devices such as a track ball. The monitor is a typical computer monitor capable of producing computer graphics.

Computer system (115) contains several elements namely one or more central processing units—CPUs—(145), memory (140), graphics processor (135) and graphics display generator (130). In a manner as appreciated by those skilled in the art, input devices (120) provide input signals to CPU (145). Memory (140) contains both read-only-memory (ROM) and random-access-memory (RAM). CPU (145) accesses, along line (150), memory (140) as necessary to execute particular programs and retrieve and create specific data files. Additionally, the CPU accesses, as necessary, files and programs from mass storage device (125). As the files and programs are retrieved from mass storage device, these files and programs are typically stored within the RAM situated in memory (140). Graphics processor (135) is the main component of our inventive visualization tool. Generally, the graphics processor can be implemented as either a hardware circuit or, preferably, as a software program recalled from memory (140) and executed by CPU (145). In either implementation, the graphics processor accesses memory (140) to retrieve and create specific data files. Additionally, the CPU accesses, as necessary, files and programs from mass storage device (125). As the files and programs are retrieved from the mass storage device, these files and programs are typically stored within the RAM situated in memory (140). Graphics processor (135) is under direct control of CPU (145).

In operation, the graphics processor produces a pixel map (pixmap) from trace data. The pixmap is used by graphics display generator (130) to produce, on monitor (105), specific types of displays, such as display formats. If more than one display format was selected, then more than one data structure is produced. As each data structure is produced, the graphics processor stores them in the RAM within memory (140). Afterwards, graphics processor (135) converts a subset of all the data structures into a pixmap. Then, the pixmap is transferred to graphics display generator (130). In response, the graphics generator produces a graphic display window containing a graphical representation of the data structures representing the events.

Through manipulation of the input devices, the user can manipulate the displayed representation within the display window. In particular, the user can move the representation in time relative to the display window. In this manner, event data will appear to progress in a time sequential manner through the window.

Figure 2:
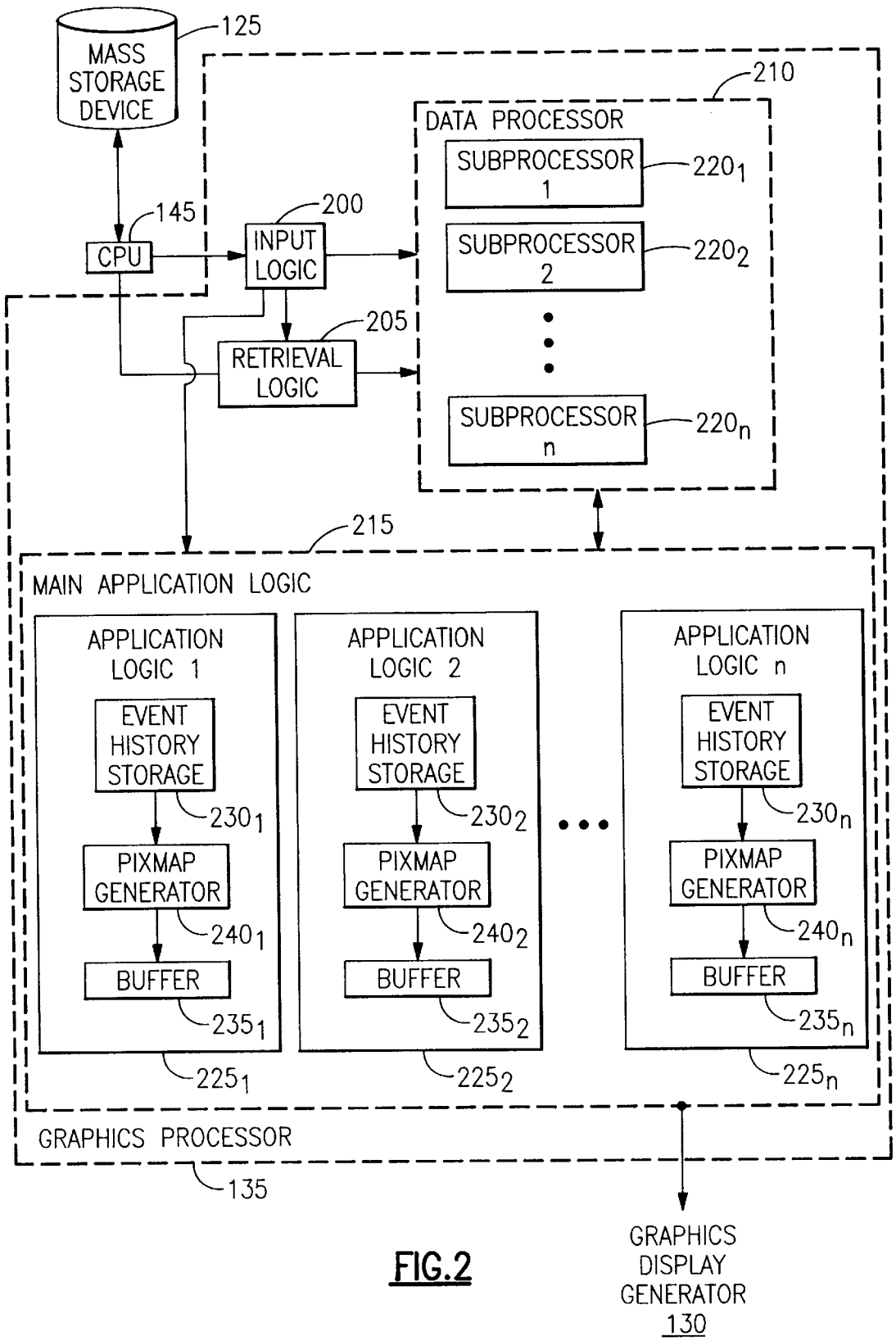
FIG. 2 is a block diagram of graphics processor.

FIG. 2 is a block diagram of graphics processor (135). Illustrative trace data is shown as an example for the following detailed discussion of the operation. Graphics processor (135) contains input logic (200), data retrieval logic (205), data processor (210), and main application logic (215). A user enters functional control commands through the input devices. The resulting signal generated is first interpreted by the CPU and then sent to the input logic for implementation.

User can then select the trace data that needs to be displayed and which is currently stored as a trace file. Input logic (200) issues a retrieval command to data retrieval logic (205) to retrieve the desired trace file from mass storage. The file is retrieved in time sequential order, one datum at a time. The retrieved logic (205) then transfers the retrieved events to data processor (210). Specific implementations of such retrieval logic are well known in the art.

Data processor (210) translates the events into data structures useful for generating displays. Sub-processors ($220_1$, $220_2$, . . . $220_n$) -where n is an arbitrary integer value-, one for each selected display format, are used to appropriately process the incoming events. In this manner, a display representing parallelism at periodic time intervals would be produced from a stream of sequential data structures. Parallelism is a term of art which defines a total percentage of processors, in a parallel processing computer, which are processing data at any specific instant of time. To facilitate generating a parallelism display, each data structure is produced, at periodic intervals, from CPU utilization events. The percent of CPU utilization time is measured and calibrated. By summing the CPU utilization values for all processors operating at one instant, a total CPU utilization value is determined, which is also calibrated.

From these data structures, a data point (pixel value) can be generated on a display having time as an abscissa axis and total CPU utilization as an ordinate axis. The data structures are transferred for further processing from data processor to main application logic (215) as they are generated. Each sub-processor is associated with a corresponding application logic ($225_1$, $225_2$, . . . $225_n$). Each application logic has an associated and dedicated RAM memory space situated within memory (140) (FIG. 1) and shown as ($230_1$, $230_2$, . . . $230_n$) in FIG. 3. Thus, as the data processor (210) generates data structures, these structures are passed directly to the event history storage associated with each application logic. The event history storage stores many more data structures than are required for the application logic to generate a particular display. The CPU dynamically allocates an amount of RAM for event history storage up to an amount capable of storing the entire requested trace file.

Simultaneously with storing the data structures, each pixmap generator ($240_1$, $240_2$, . . . $240_n$) converts a subset of corresponding data structure in a corresponding event history storage into a pixmap. Each pixmap will ultimately become single display within a window portrayed on the monitor. As such, the plurality of pixmap generators, in turn, produce a plurality of pixmaps that correspond to a plurality of displays on the monitor. Each particular pixmap is generated from a subset of data structures retrieved from the event history storage corresponding to a particular pixmap generator. (This subset is called a subrange.) Each pixmap generator produces a pixmap that corresponds to the specific display selected by the user. Each pixmap generator stores its respective pixmap in an assigned memory space symbolized by buffers ($235_1$, $235_2$, . . . $235_n$). Updates are also made by the generators and new pixmaps are generated if need arises.

Figure 3:
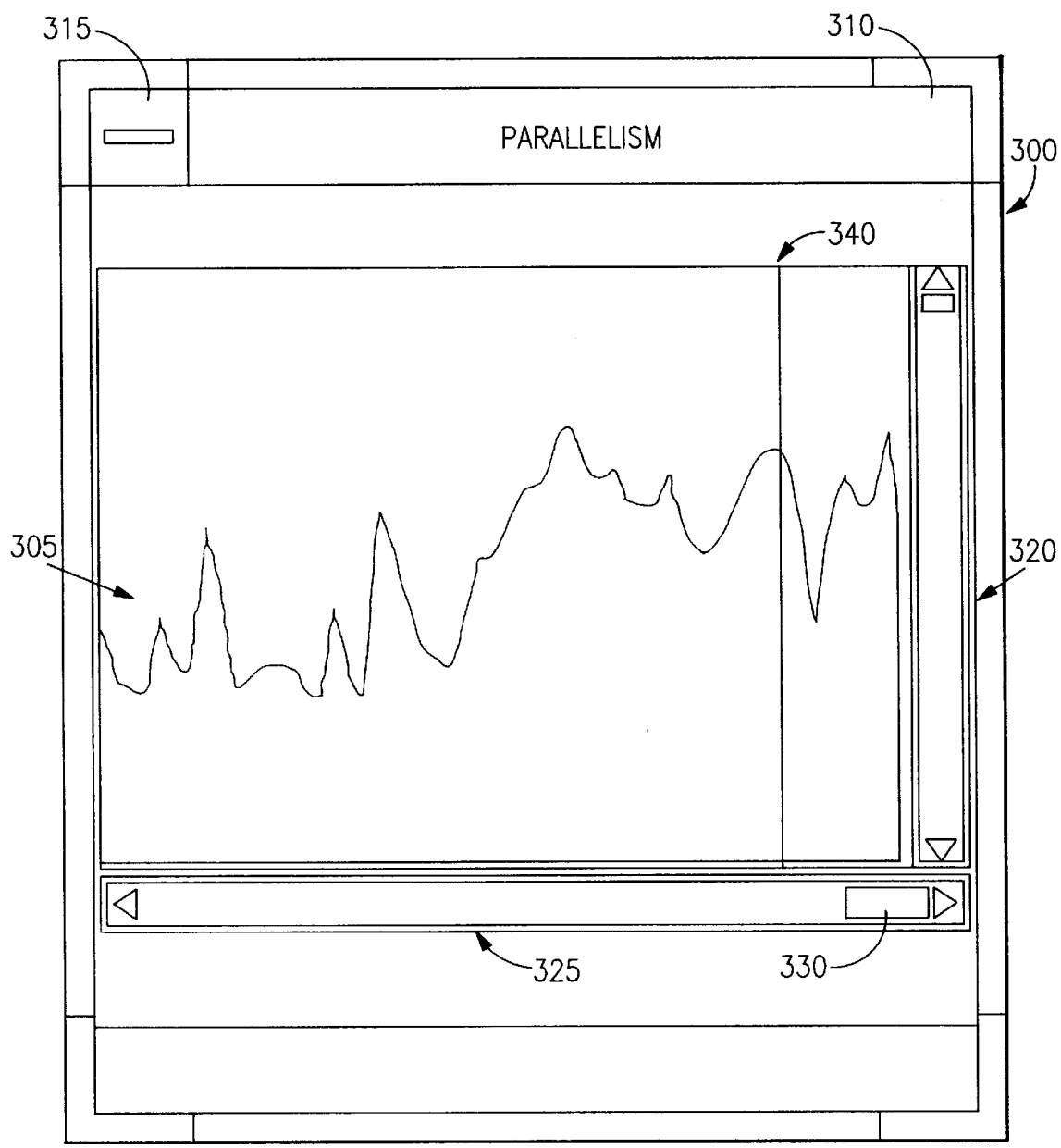
FIG. 3 is an illustration of the monitor screen containing window and parallelism displays in accordance with the teachings of the present invention.

FIG. 3 shows illustrative parallelism display (305) located in window (300) on screen (110) of the monitor. A parallelism display depicts cumulative parallelism of multiple processors operating in a parallel computer. Window (300) includes title bar (310) having a conventional window button, e.g., window button (315). Additionally, window (300) contains scroll bars (320) and (325). In some display formats scroll bar (320) moves the display in a vertical direction. This manner of display manipulation is well-known in the art. The length of scroll bar (325) represents a present length of the trace file stored in the event history storage. Indicator (330), specifically its width and relative position within scroll bar (325), indicates what portion of the trace file stored in event history storage is presently displayed in window (300) with respect to the entire trace file. Consequently, as described below, when a user reviews the events displayed, indicator (330) moves as the displayed data moves in time. The implementation and use of the window menu button and the scroll bars are well known and will, therefore, not be described in further detail.

Additionally, the display shown in FIG. 3 includes reference line (340) known as "time-line". Illustratively, the time-line is positioned at a point approximately 85% of the window length, measured from the left window boundary. However, this time-line position is merely illustrative and it can be further defined dynamically by a user or, alternatively, at the time when the visualization tool is being initialized by an automated program. All non-time dependent displays portrayed are synchronized to the time represented by the time-line. As such, the user is provided a synchronous portrayal of information representation by the displays.

FIGS. 4A through 4F show a parallelism display at periodic intervals as events are "played" across the window. To enhance understanding, the reader should simultaneously refer to all these figures throughout the following discussions.

Figure 4A:
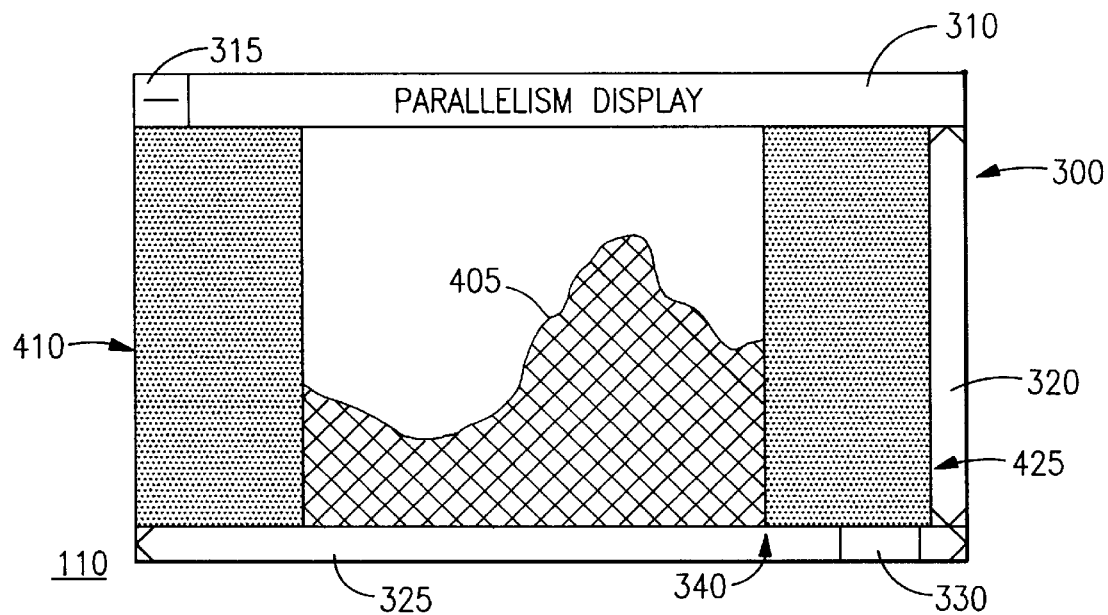
FIG. 4A through 4F collectively show monitor screen at periodic intervals of time while visualization tool produces parallelism display from trace data.

Assuming for simplicity that the user has only selected a single display format, such as a time-varying display format portraying parallelism, the visualization tool will use only a single sub-processor, application logic, event history storage, pixmap generator and pixmap buffer. Using the input devices, a user requests that a specific trace file be "played". As the data processor produces each associated data structure, the processor places each data structure in an associated history storage. Additionally, as shown in FIG. 4A, simultaneous with storage the data structure is converted into a pixmap and displayed in window (300). The first data structure is displayed at time-line (340). As new events are created, the data is refreshed and new display items appear.

Figure 4B:
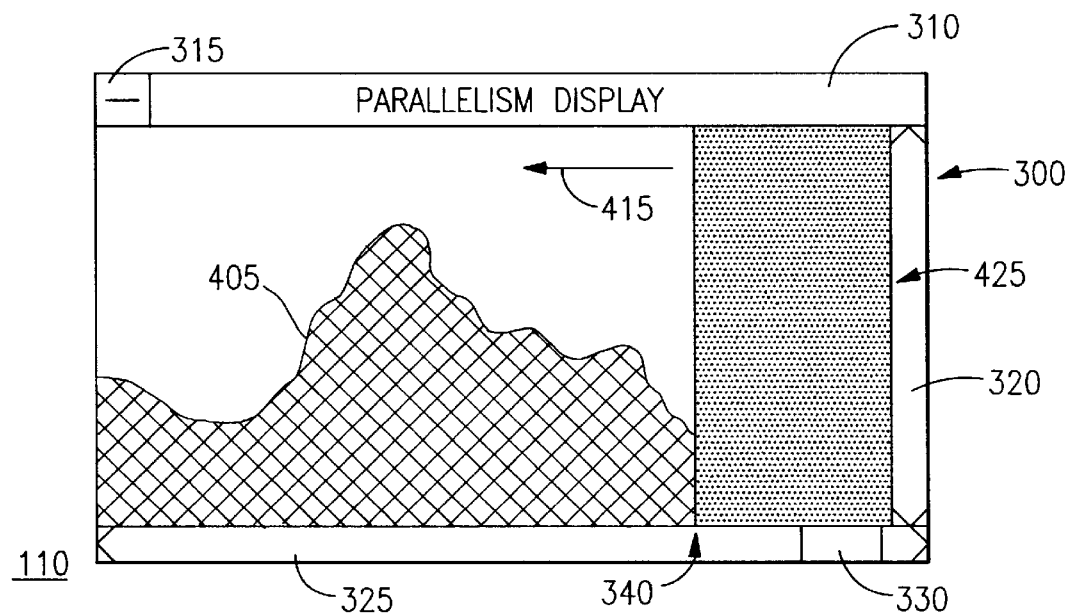

FIG. 4B depicts the state of window (300) after enough events have been processed and displayed to fill the window. As each event is representatively displayed at time-line (340), graph (405) moves to the left. The data structures representing the events that no longer are displayed in the window are stored in the event history storage associated with this display. It is possible for the user then to scroll backwards or forwards to look at a new subrange. As such, all of the instantaneous displays, e.g. pie charts, bar graphs and the like, are synchronously updated to represent the events which correspond to the time-line time. Additionally, other time-varying displays will also synchronously update as well. Subsequently, if the scroll function is requested by the user again, a new-subrange is also provided and the process duplicated. Typically, scroll speed is controlled by the input devices. A higher selected speed will increase the time increment between pixmaps.

Figure 4C:
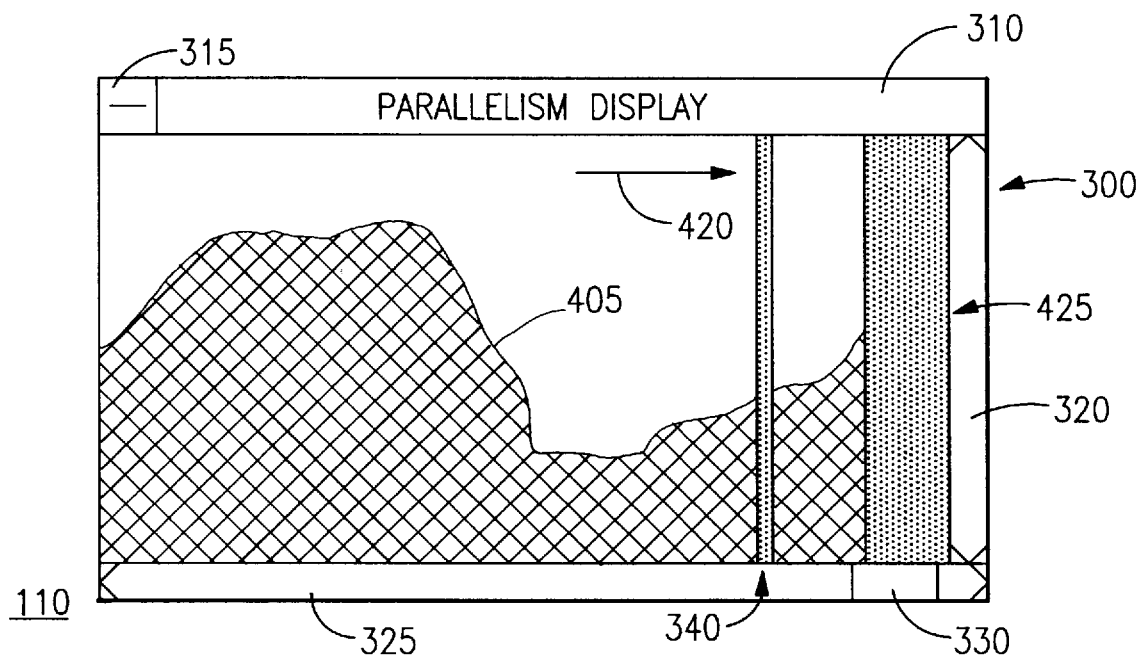

FIG. 4C shows window (300) at a moment when a user is beginning to scroll "backward" through the displayed events (as indicated by arrow 420). As such, the last event in the trace file displayed (shown at edge 426 of black area 425) moves to the right and a new sub-range of data structures is retrieved from even history storage and used to generate successive pixmaps which add to graph (405) on the left. In this manner, graph 405 appears to move, or scroll, to the right.

Figure 4D:
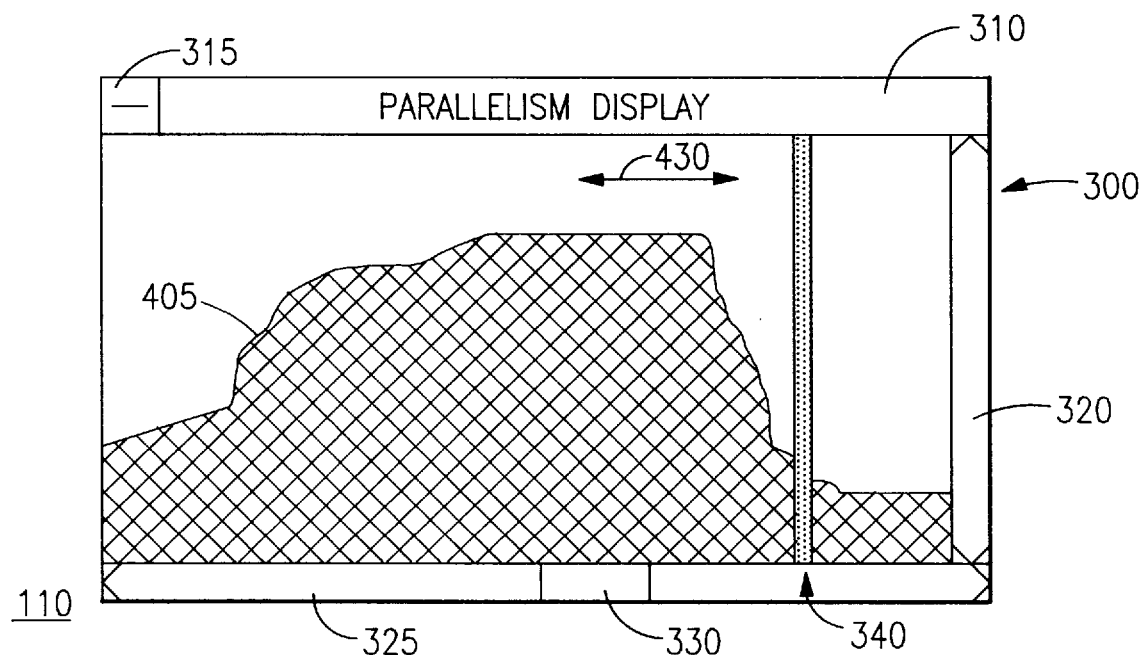

FIG. 4D shows the display after a full window of data structures has been recalled from event history storage and converted into a pixmap which fills the entire display window. As discussed above, time-line (340) forms a reference position within the display. As such, the display to the right of the time-line represents trace data having a time of occurrence later than that corresponding to time-line time and the display to the left of the time-line represents trace data having a time of occurrence earlier than that corresponding to the time-line time. Using the scroll function, a user can move back and forth (as indicated by arrow 430) through time to review events in the trace file.

Figure 4E:
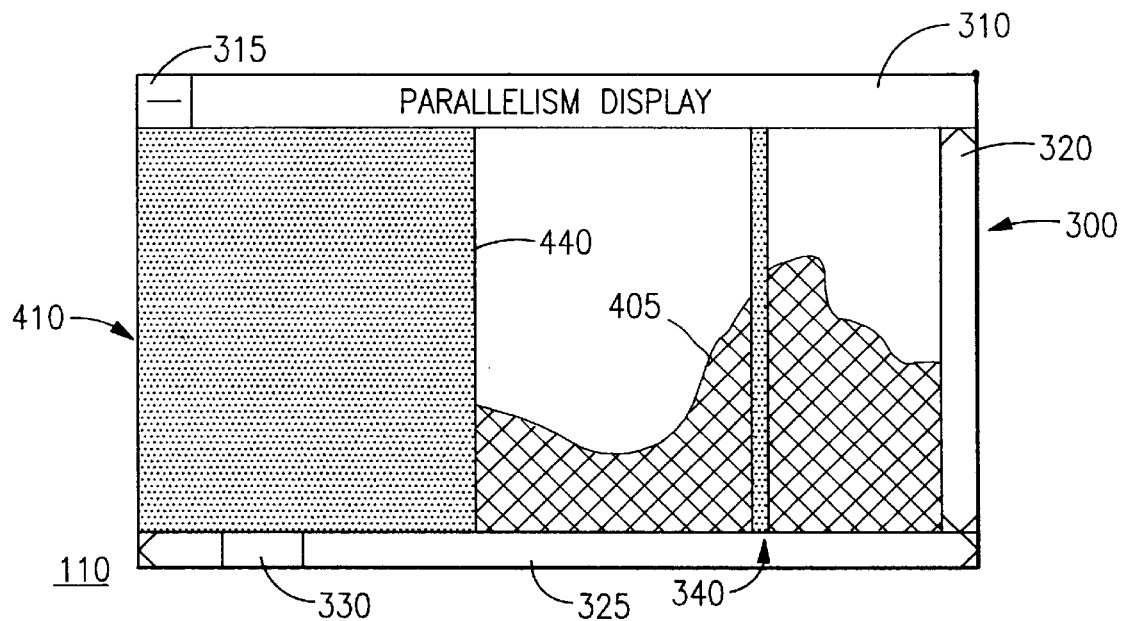
Figure 4F:
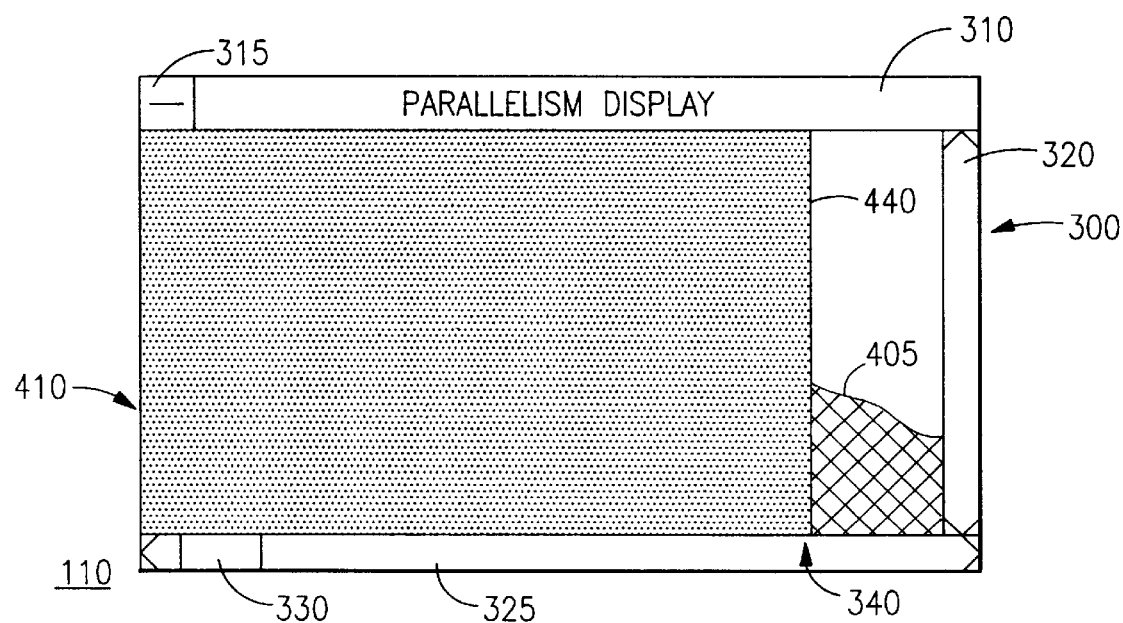

FIG. 4E shows the display after the scroll function has moved the display to the beginning of the event history storage. The first event(s) of the trace file is represented by a pixel at edge (440) of black area (410). As show in FIG. 4F, if the user continues scrolling, edge (440) of black area (410) will stop at time-line (340). In this manner, the beginning of the event history storage is easily recognizable to a user.

Though only one window has been illustratively depicted on the screen at any instant, our invention can produce multiple windows on a single screen. In this manner, a user can simultaneously view various characteristics of a trace file. For instance, upon user selection, our invention creates instantaneous displays, such as pie charts, bar graphs and the like. The same process by which our invention recreates time-varying displays, such as the parallelism display of FIG. 3 and FIGS. 4A–4F, is used to create an instantaneous display. The only difference is that different field information is called from each event to produce a data structure which corresponds to a particular format of instantaneous display. As in the parallelism display, the data processor produces the data structures for the instantaneous displays and the application logic stores them in an event history storage. Each individual instantaneous display format has a respective sub-processor and event history storage. Typically, a given instantaneous display represents events that occur simultaneous with the time corresponding to the time-line time in a time-varying display. In this manner, all of the instantaneous displays shown at any one time are synchronized to one instant in time, namely, the time-line time. If a user scrolls a given time-varying display, all the instantaneous displays will simultaneously update to display information corresponding to the event(s) now lying under the time-line in the time-varying displays. Additionally, other time-varying displays will synchronously update as well.

Figure 5:
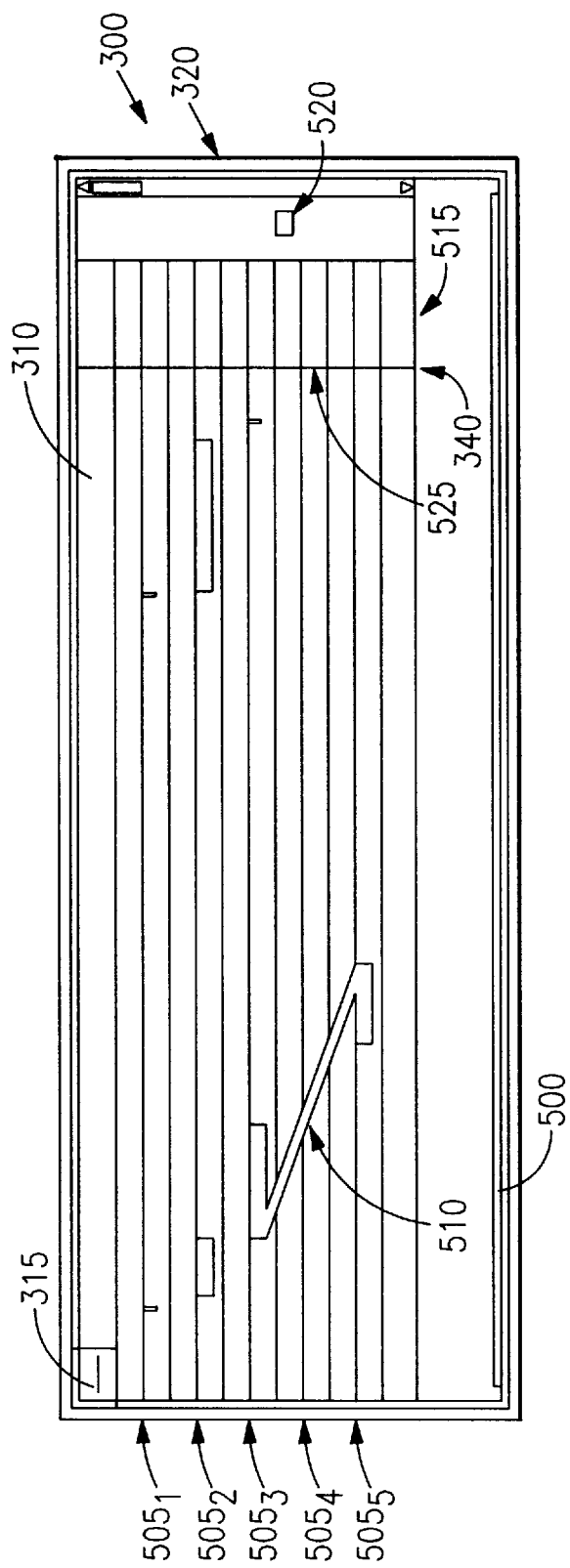
FIG. 5 portrays the monitor screen containing window and message passing display in accordance with one embodiment of the present invention.

FIG. 5 shows window (300) containing another important time-varying display format, namely, message passing display (500). Generally, the data structures used to produce the message passing display are derived from send and receive events. Specifically, the fields used from both send and receive events to form a data structure are the type of message field, the start and stop and stop time fields, processor number from which the message is sent, and processor number to which the message is sent. Display (500) contains rows $505_1$, $505_2$, $505_3$, $505_4$ and so on that represent each processor in the parallel processing computer. Send events are displayed in a color which contrasts with a color used to display receive events. For example, display 500 may use green pixels to represent send events and red pixels to represent receive events. Whenever a send event passes information from one processor, for example processor 3 (represented by row $505_3$), to another processor, for example processor 5 (represented by row $505_5$), the display depicts a line, such as line (510) connecting the two rows together. Such a connective path will visually indicate to the user the exact path along which a message has passed. Additionally, time-line (340) is provided to give the user a stationary time reference. As with the parallelism display, here the displayed message-passing information can be scrolled forward and backward beneath the time-line. In this manner a user can quickly review the display to note the message passing activity throughout a trace file.

An additional feature of this display appears to the right of data area (515); specifically shown as area (520), an instantaneous event area. Therein any event which is presently aligned with time-line (340) is displayed. This function is known as an event highlighting function. For example, if a send event from processor four presently lies beneath the time-line (525), green square appears in instantaneous event area (520). This is an especially useful feature when the resolution of the display is very coarse and many send and receive events occur within a short amount of time. Under these conditions, the user can view the instantaneous events which are represented in the instantaneous event area as the user scrolls, event by event, through the display. If however, a pixel under the time-line represents a number of pixels, i.e., course resolution, then indicator square (525) appears on the display to notify the user that some events are hidden. To view the hidden events, the user may magnify the display until each pixel in the display represents a single event. Those skilled in the art will understand that such a highlighting function is useful in other display formats other than a message passing display.

Additionally, if more processor rows are displayed than fit in window (300), vertical scroll bar (320) can be used to display processor rows that are presently not shown in the viewing area of window (300).

Figure 6A:
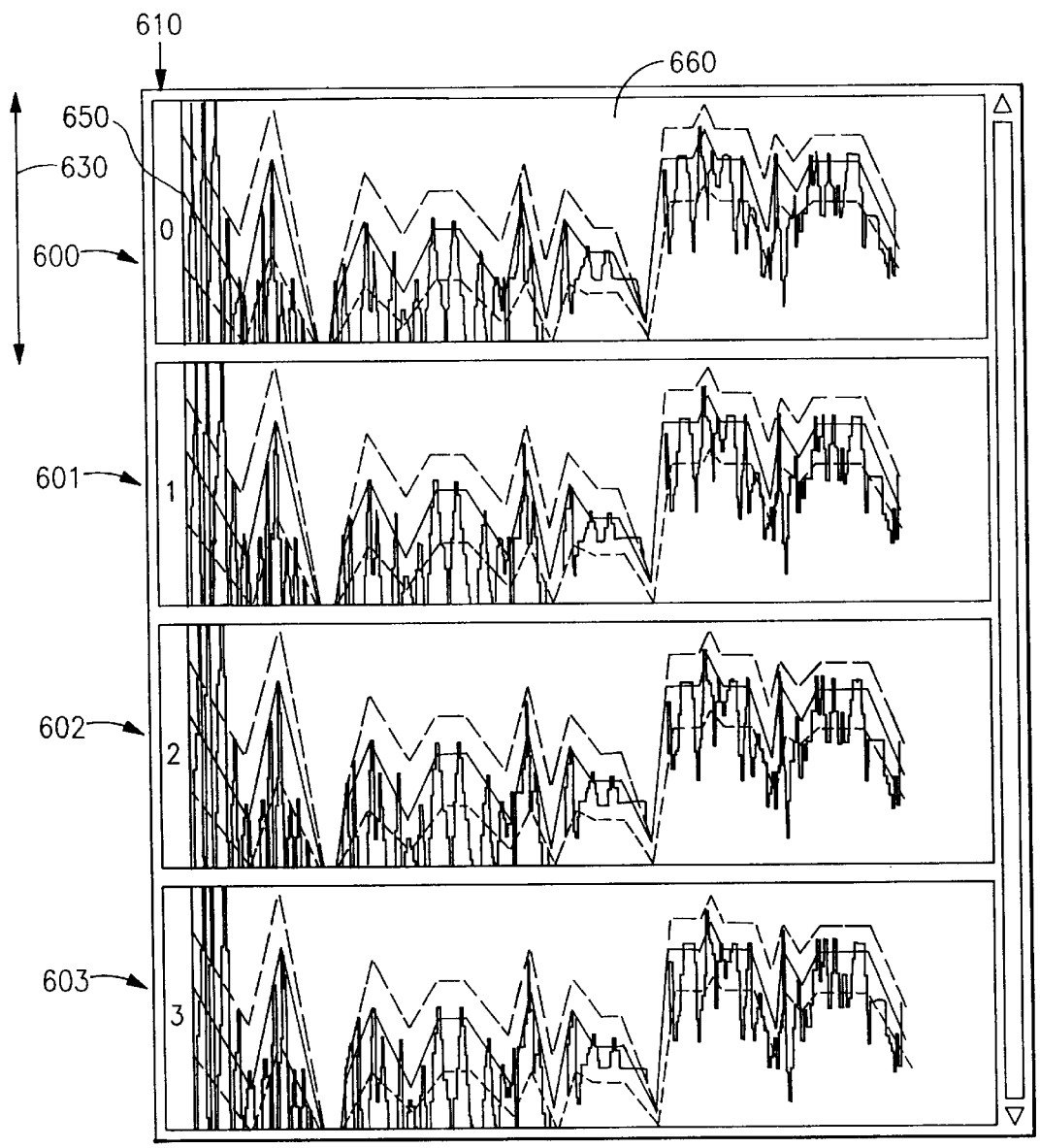
FIG. 6A is an illustration of the present embodiment showing processor activity strips in ascending order by processor id. number.

FIG. 6A is an illustration of an embodiment of the present invention showing multiple strip graphs (600–603) at the same time. Each processor is allocated a horizontal strip called STRIP_HEIGHT (630) pixels high in a drawing area, which can in one embodiment be scrolled up and down with a vertical scroll bar. At some point next to each strip is a processor id number (600–603). Each of the four strip graphs shown in FIG. 6A with their Strip_Heights indicate an activity diagram for a different processor. Although only four diagrams are shown in FIG. 6A at the same time, the user can customize the screen to contain more/less activity diagrams to be viewed at one time. (Scrolling the screen will also reveal new diagrams, when applicable). The strip graphs in FIG. 6A are each an illustration of specific processor activities for processors 0–3, indicating system utilization over time. Here, processor utilization is a function that varies between zero and a maximum number (Max). At certain intervals of time, processor utilization time is sampled to reveal a value N, where N is between zero and Max. It should also be noted that although it is optimal that all such samplings be taken at equally spaced instances of time, processor and task completion activities may not allow for such consistency as a practical matter. Therefore, as each record in the trace file is read, the strip corresponding to the record's processor id number is advanced by a number of pixels proportional to the difference between the current record and that of the previous record's time.

The sampled value is then plotted as point P, both as a function of time and processor utilization. The placement of P in relation to the STRIP_HEIGHT is proportionally equal to the ratio between N and maximum processor utilization. A straight line is then drawn from a previously plotted point P' to the currently plotted point P so as to complete one cycle in the graph drawing process. In this way an activity diagram (660 in strip 600) is drawn for each processor.

During each time sampling, average processor utilization value is calculated alongside the mean and the standard deviation, for all processors. Subsequently, in each strip, an alternate graph, preferably of a contrasting color, is generated that compares the specific processor utilization to the average utilization over time (650 in strip 600). (In the alternative, instead of average, mean, standard deviation, or other user selected graphs can be generated.) In an alternate embodiment, the average processor value graph is further enveloped in a shaded region of a third color which extends from one standard deviation above it to one standard deviation below it. As the user scrolls up and down the stack of processor strips, the display for any processor which spends a large amount of time significantly above or below the average across all the processors will catch the user's eye.

The display can also provide a toggle (not shown) for a pop-up menu such as the one shown in FIG. 6B. The pop-up menu presents the user with statistical data and push buttons which will jump the display to the strip for the processor with the largest average value (623) and the strip for the processor with the smallest average value (624). The pop-up menu also displays the mean (625) and the standard deviation (626) of all processors, and allows the user to sort the strips by mean, by standard deviation or by processor number, either in ascending or descending order (627–628). Other mathematical functions and/or orders can be added/deleted by the user in order to customize this pop-up menu according to the desired function.

Figure 6C:
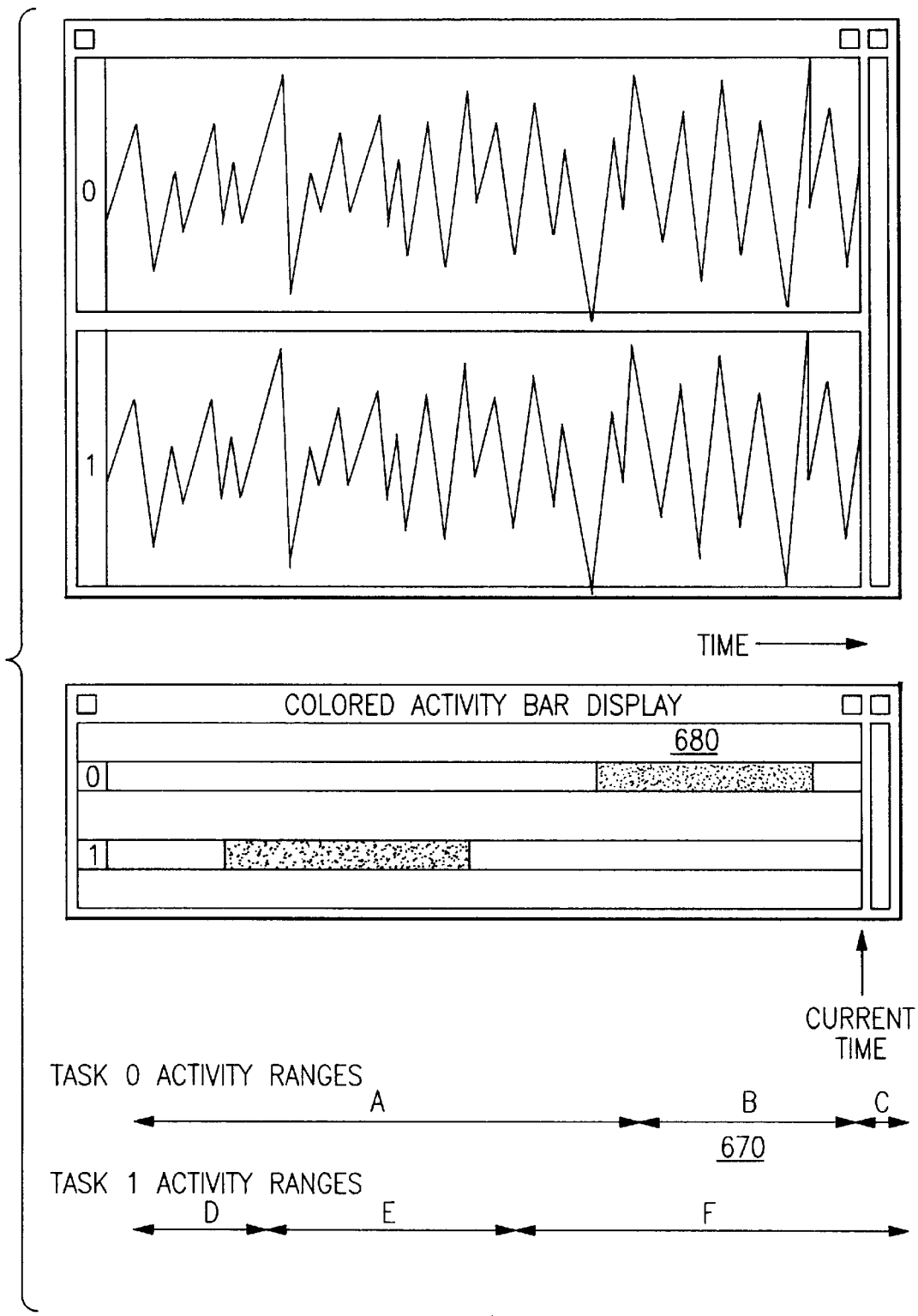
FIG. 6C is an illustration of a moving window as discussed in one embodiment of the present invention.

In another embodiment of the present invention, as shown in FIG. 6C, a moving window 670 of a different color can appear to indicate a certain time slot between the current time and a previous time. In addition, a moving window activity bar (680) can be selectively made to move with the moving window indicating as different tasks are started and completed. The moving window itself, can be scrolled backwards in time (away from the current time) as to reveal more detailed information about a certain activity. For example, the user can decide to only view the strip graphs starting at a time equal to T, rather than from its origination point 0. Note that with or without the moving window, scrolling one graph backwards or forwards in time will automatically move other strip graphs to the similar time instance. The average, standard deviation and mean can be selectively calculated for the range T or other selected activity ranges.

Figure 7:
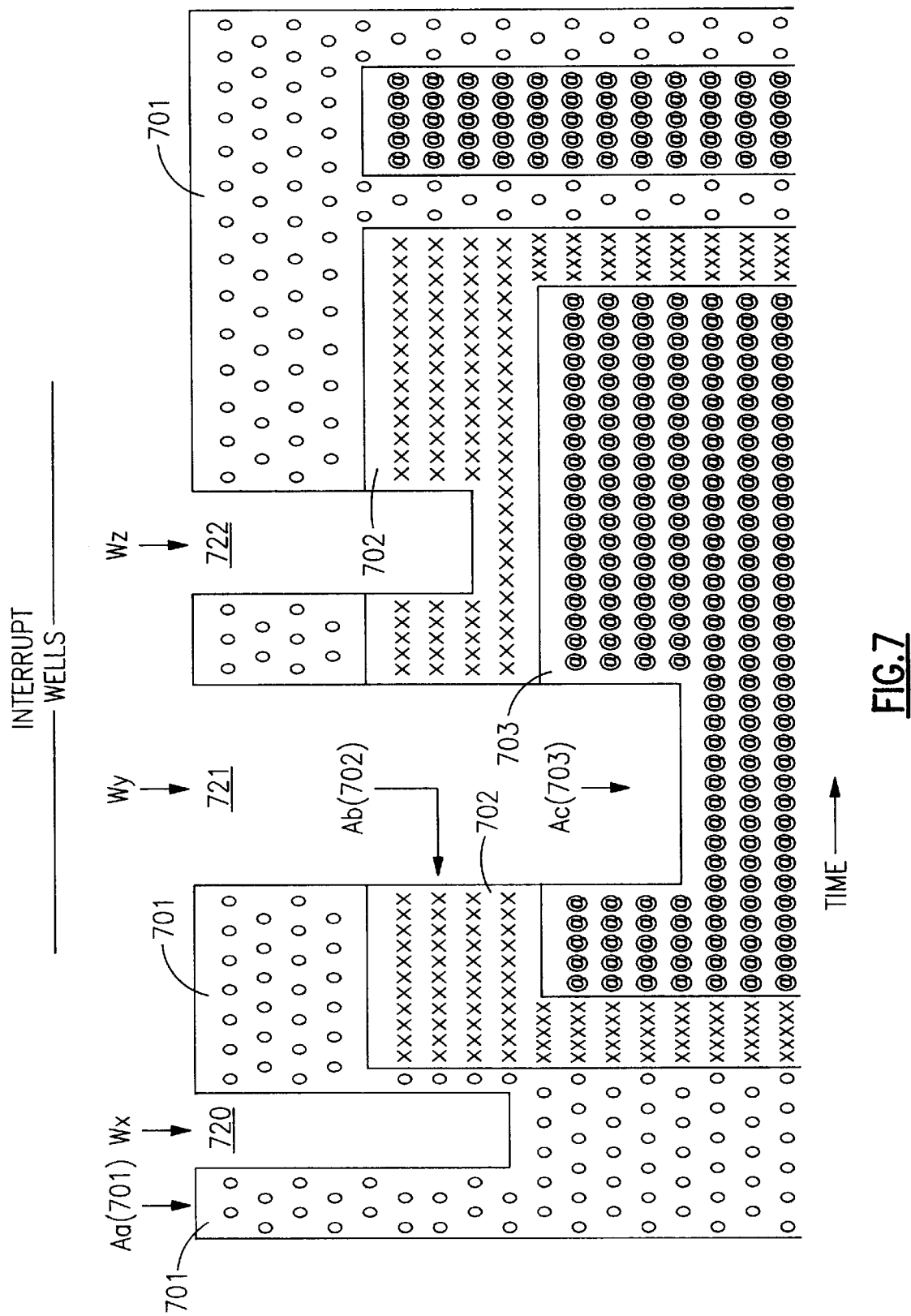
FIG. 7 is an illustration of a display showing program activity and highlighting any system inactivity period.

The highlighting of processor activities above or below an average or standard deviation, can be used in a variety of ways such as workload distribution-redistribution and/or problem resolution. In one embodiment of the present invention, as depicted in FIG. 7, an additional step is taken to determine and resolve any such processor problems, possibly relating to the same activity range T. In FIG. 7, a display is presented that depicts program activity as it relates to other system activities that prevent the program from doing useful work, in a single understandable and modifiable graphical representation. The data can be presented as collected from the system or new data derived from the collected data can be displayed under the control of the user.

The display as shown in FIG. 7 consists of inverted "U" shaped figures (701–703), shown as regions Aa (701), Ab (702) and Ac (703). Each inverted "U" figure represents some activity. An inverted "U" figure with another nested inverted "U" figure represents another activity requested by the first, e.g. a function calling another function or a portion of code doing another labeled portion of work. The area within each inverted "U" figure is shaded in with a unique color. The shaded colors help the user quickly identify different activity and the beginning and end points of the activities. When system activity occurs, such as CPU's loss of control to another process an "interrupt well" is created in the shaded figures for the duration of the activity. The interrupt well represents the portion of time the shaded figure was kept from doing its own activity. Areas (701), (702) and (703) in the FIG. 7 represent three different color shadings. These three areas each also represent different activities and/or functions. An important part of this diagram is its ability to quickly show where the interrupts occurred. The interrupts are identified by the wells dug into the shaded areas of the function calls. These wells are identified by different labels (720), (721), and (722), if desired.

A user looking at this display can quickly determine that there were three interrupts during their program execution and the interrupt that occurred during a certain function or activity which had the longest duration. It is also possible for the user to further customize the diagram of FIG. 7. In one embodiment of the present invention, a pull down menu (not shown) or other similar means can be utilized to provide a zooming effect in the diagram to be viewed. For example, FIG. 7 provides for three levels of nested programs. Area Ac, 703 is nested in area Ab, 702 which is in turn nested in area 701 or Aa. This creates three levels of nesting. Now if the user wants to only look at area 703 or perhaps at areas 703 and 702, to more clearly analyze the details of the activity, the user can do so by specifying how many levels of depth should the diagram provide. By contrast, once the user is finished with looking only at detailed descriptions of level 703, the user can go back and look at more levels of depth if this is desired. It should also be noted that as before more than one graphs or diagrams can be concurrently viewed by the user at the same time and changing the time window frame on one diagram can automatically adjust the other viewed diagrams to reflect the same time interval.

Figure 8:
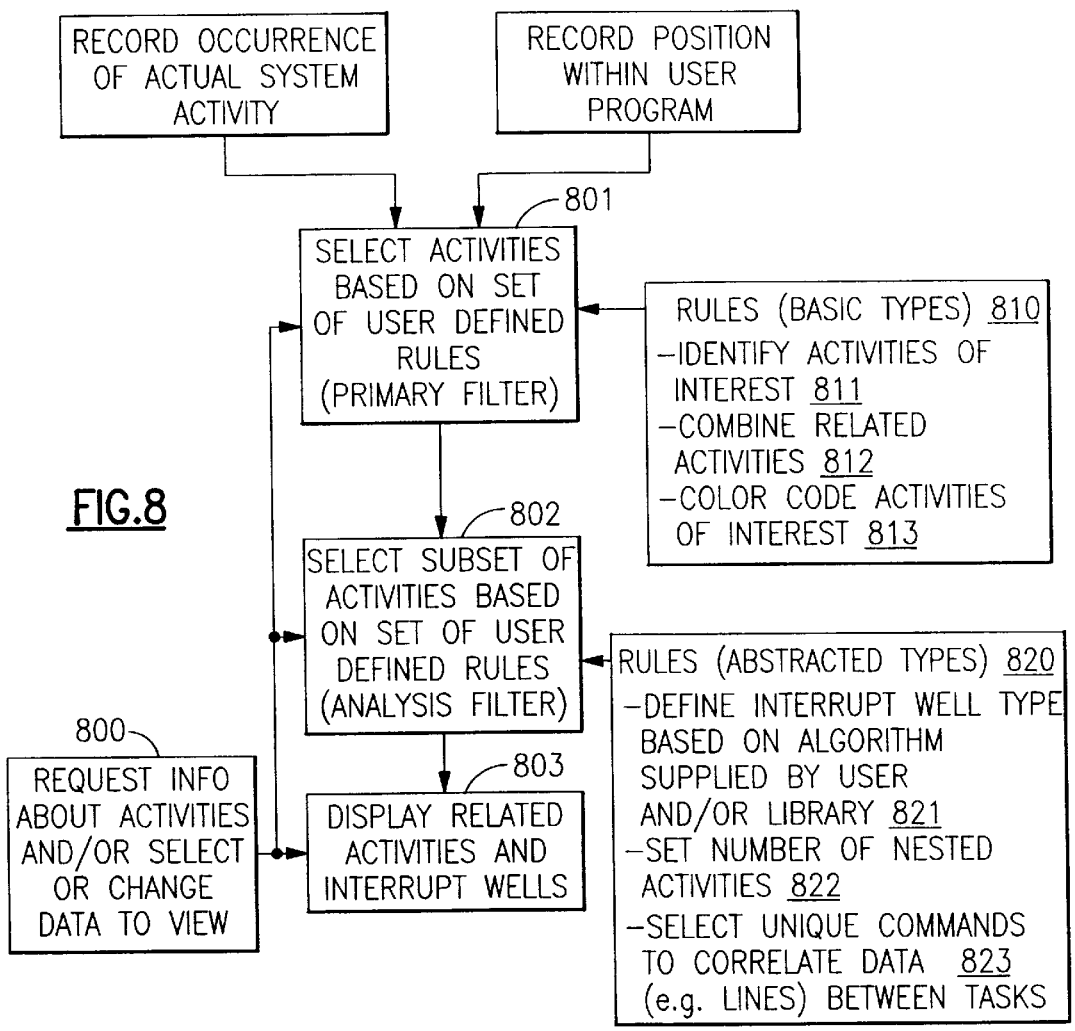
FIG. 8 is an illustration of the adaptivity of the present invention in creating different types of data or abstractions of data in one screen for a program activity display.

As shown in FIG. 8, the display has the adaptivity to create different types of data or abstractions. Information could be obtained by selecting activities or wells on the display with the mouse or similar devices. Examples of these activities can be program/subroutine name, length of execution time, length of interrupt, hierarchy of calls in the program that were interrupted and/or type of interrupt. The ability of the display to convey where a program is interrupted is unique but the display can also represent many different types of data (800–803). Data passed to the display can be chosen from available types or the systems programmer or user can create additional "abstract" types that have special meaning to the user (800). Different types can be colored alike or differently to add meaning to the display (813). The interrupt wells can also be colored based on the type of interrupt to add further meaning for the user (813) and (822).

Figure 9:
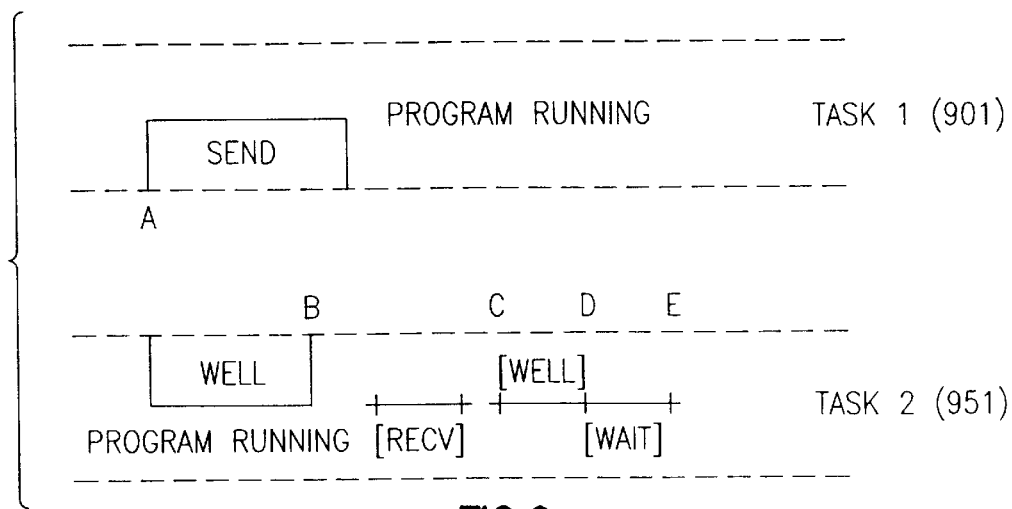
FIG. 9 shows an example of a display as defined by an Application User.

FIG. 9 shows an example of a display as defined by an Application User. Here, the display represents communication between two tasks of a parallel processor (901) and (951). Point A is when the users program issued the send and E is when the users program completed receiving the message. The message started to arrive at task 2 at point B and finished arriving at point C. Filters were defined to identify wells that show when the program could be doing useful work but was not based on the synchronization of activity between the systems.

The foregoing discussion focused on generating a time-varying display such as a parallelism or message passing display. However, instantaneous displays, such as bar graphs or pie charts, are generated by the same graphics processor routine. However, for these displays, the instantaneous displays portray events that occur at the time-line time only. As such, whenever the time-varying displays are updated, e.g., scrolling, the instantaneous displays are updated as well. In this manner, all the displays produced by the graphics processor routine are synchronized to the time-line time. Consequently, the multiple, synchronized displays generated by our invention afford a user the ability to quickly access, easily review and understand trace file data.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A visualization tool for graphically displaying trace data by converting trace data into data structures and creating pixel map diagrams from each data structure, comprising:

a mass storage device for storing data structures and diagrams;

a computer system connected to said display monitor and said mass storage device, said computer system having a plurality of processors;

said computer system calculating and then storing in said mass storage device processor utilization time for each processor individually as well as an average processor utilization time across all said processors;

at least one input device connected to said computer system;

a display generator located in said computer system for generating a plurality of activity diagrams, said activity diagrams showing processor utilization for each processor over time during sampled intervals, said generated activity diagrams also providing graphical information about said previously stored average processor utilization time across all processors and identifying each of said activity diagrams by providing a processor id number on each of said strip graphs;

means for scrolling said activity diagrams backwards or forwards to display other selected time intervals and scrolling one of said processor activity diagrams to one time interval will automatically scrolls all other activity diagrams to said same time interval;

a display monitor connected to said computer system for displaying pixel map diagrams, so that at least two of said activity diagrams can be displayed simultaneously in form of strip graphs for identical time periods; and means for selectively displaying multiple processor activity diagrams at one time on said monitor screen and scrolling said monitor screen backwards and forwards reveal any other activity diagrams present.

2. The visualization tool of claim 1, comprising a pop-up menu screen generated by said computer system and accessible via a toggle switch located on said activity diagrams screen.

3. The visualization tool of claim 2, wherein said pop-up menu allows a user to sort said multiple activity graphs according to their processor id number in descending order.

4. The visualization tool of claim 2, wherein said pop-up menu allows a user to sort said multiple activity graphs according to their processor id number in ascending order.

5. The visualization tool of claim 1, wherein said computer system has means for calculating standard deviation for said processor utilizations over time, said standard deviation ranges then being added to each of said processor activity diagram so as to envelope average utilization graph.

6. The visualization tool of claim 5, wherein said standard deviation ranges are further highlighted by regions appearing above and below average utilization graph on each processor activity diagram.

7. The visualization tool of claim 1, wherein a moving window is provided indicating a portion of time up to current time.

8. The visualization tool of claim 7, wherein said moving window displays more detail information about said activities in said processor activity diagram.

9. The visualization tool of claim 7, wherein said moving window can be scrolled backwards or forwards to cover different time ranges.

10. The visualization tool of claim 7, wherein a moving window activity bar is provided to reflect the completion of different tasks.

11. The visualization tool of claim 1, wherein interrupts are displayed as highlighted regions in said display diagram; said interrupt completion time being also indicated upon said completion.

12. The visualization tool of claim 11, wherein said displayed interrupt regions are displayed in different formats to distinguish them from one another in case one diagram displayed comprises of more than one interrupt region.

13. The visualization tool of claim 12, wherein said different tasks are indicated in different formats to distinguish them from one another, said tasks nested in other parent tasks being viewed as imbedded areas in said parent task but having a different format than said parent task, said parent task and said imbedded task constituting two levels of task viewing depth.

14. The visualization tool of claim 13, wherein said user can specify depth of task levels to be viewed.

15. The visualization tool of claim 11, wherein said tasks are indicated in "U" shape formats, each being displayed in a different color; and any interrupts taken is shown as a protruding "well" like structure on said diagram, said interrupts also being of different colors in case more than one interrupt region is indicated.

16. The visualization tool of claim 1, wherein interrupts are displayed as highlighted regions in said display diagram; said interrupt completion time being also indicated upon said completion.

17. The visualization tool of claim 16, wherein a multiplicity of interrupt diagrams can be viewed by a user concurrently.

18. The visualization tool of claim 2, wherein a toggle switch is provided on said monitor screen displaying said multiple processor activity diagrams to reveal a pop-up menu.

19. The visualization tool of claim 18, wherein said pop-up menu allows a user to sort said multiple activity graphs according to their standard deviation in descending order.

20. The visualization tool of claim 18, wherein said pop-up menu allows a user to sort said multiple activity graphs according to their standard deviation in ascending order.

21. The visualization tool of claim 18, wherein said computer system have means for calculating a mean for said utilization time across all processors.

22. The visualization tool of claim 18, wherein said pop-up menu allows a user to sort said multiple activity graphs according to their mean in either ascending or descending order.

* * * * *